United States Patent [19]

Abbott

[11] Patent Number: 5,352,633
[45] Date of Patent: Oct. 4, 1994

[54] SEMICONDUCTOR LEAD FRAME LEAD STABILIZATION

[75] Inventor: Donald C. Abbott, Norton, Mass.

[73] Assignee: Texas Instruments Incorporated, Dallas, Tex.

[21] Appl. No.: 892,096

[22] Filed: Jun. 2, 1992

[51] Int. Cl.⁵ ............................................. H01L 21/60
[52] U.S. Cl. .................................. 437/211; 437/209; 437/216; 437/217; 437/220
[58] Field of Search ............... 437/211, 209, 217, 220, 437/216

[56] References Cited

U.S. PATENT DOCUMENTS

| | | | |
|---|---|---|---|
| 4,820,658 | 4/1989 | Gilder, Jr. et al. | 437/209 |
| 4,835,120 | 5/1989 | Mallik et al. | 437/209 |
| 4,837,184 | 6/1989 | Lin et al. | 437/217 |
| 5,014,418 | 5/1991 | Wright | 437/217 |
| 5,114,880 | 5/1992 | Lin | 437/217 |
| 5,192,681 | 3/1993 | Chiu | 437/217 |
| 5,194,695 | 3/1993 | Maslakow | 437/216 |

*Primary Examiner*—Tom Thomas
*Assistant Examiner*—Kevin M. Picardat
*Attorney, Agent, or Firm*—Wade James Brady; Richard L. Donaldson

[57] ABSTRACT

The invention is to an apparatus and method for applying a plastic material to a lead frame for stabilizing the leads and retaining them in a common plane.

10 Claims, 2 Drawing Sheets

SEMICONDUCTOR LEAD FRAME LEAD STABILIZATION

FIELD OF THE INVENTION

This invention relates to semiconductor devices, and more particularly to a lead frame and method for stabilizing lead frame lead spacing and lead tip planarity.

BACKGROUND OF THE INVENTION

In producing delicate, high pin count lead frames with closely spaced inner leads, polyimide or kapton tape is often applied to the leads to maintain lead-to-lead spacing and to stabilize lead tip planarity. This operation is typically done after stamping or etching the lead frame, and after the lead frame is plated. The process includes indexing and precisely locating the lead frame unit and applying heat and pressure to a piece or pieces of precisely cut and located polyimide tape to one or more strips to the lead frame. This procedure is expensive, time consuming and subjects the high value added plated lead frame to additional mechanical handling and heat treatment.

BRIEF DESCRIPTION OF THE INVENTION

The invention is to a process and semiconductor device to which a plastic stabilizer has been applied on and between the inner leads fingers of a lead frame to stabilize lead frame spacing and planarity. The plastic stabilizer consists of a plastic preform on a support base. The plastic preform and support can be an individual preform, a strip of preforms, or a plurality of preforms on a continuous roll.

A heater block is mounted on a piston or press over an anvil type surface to apply heat and pressure to the non-preform surface of the plastic preform support base. The plastic preform is pressed onto the lead frame leads. The heat causes the plastic preform to melt onto the lead frame and between the lead frame leads, adherent to the lead frame. After the plastic preform has melted onto the lead frame and then cooled, the preform base material is peeled from the molded plastic.

The support base may have index holes, notches, or other indexing means to accurately locate the preform adjacent the lead frame prior to the application of heat and pressure.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
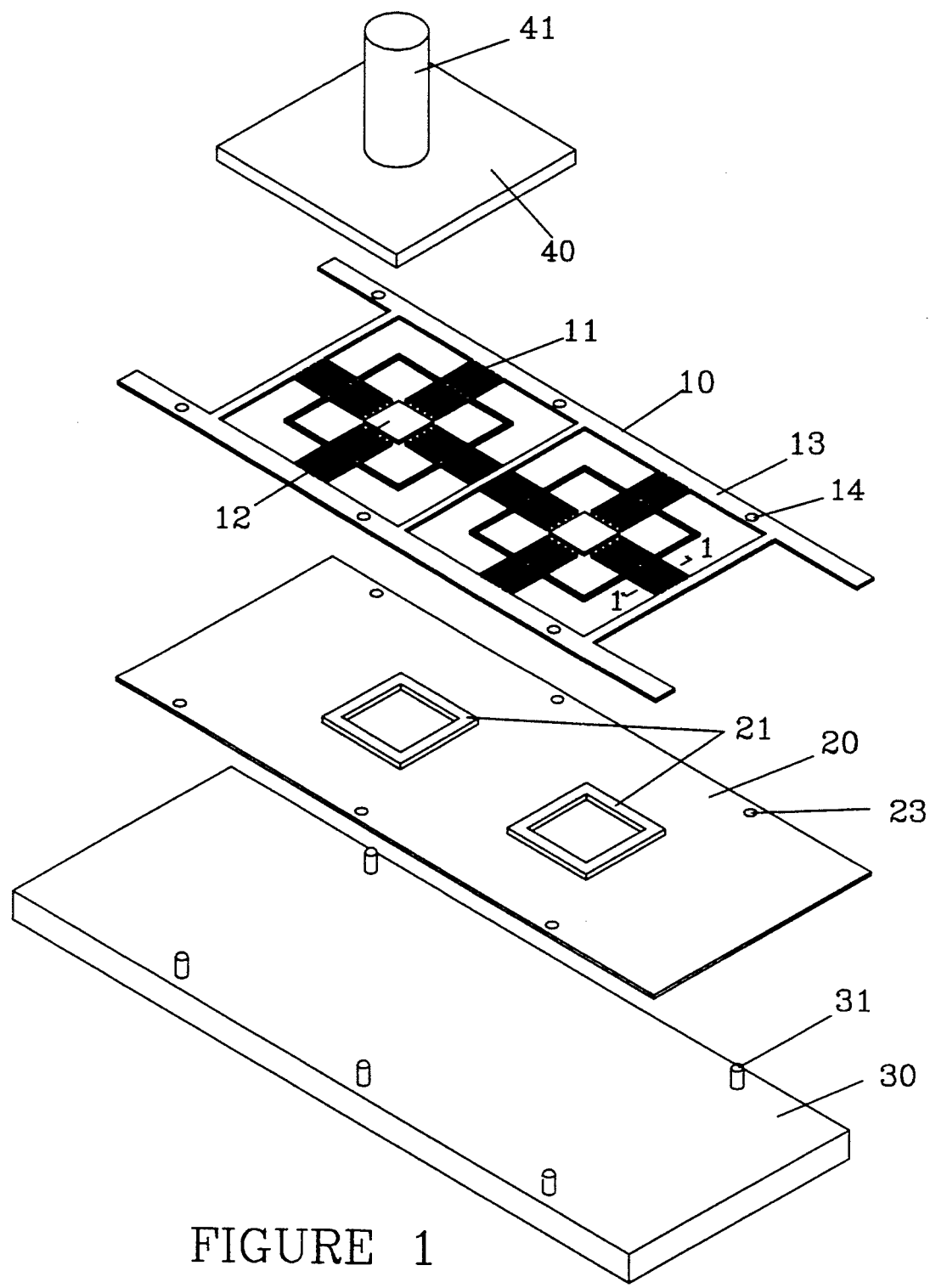
FIG. 1 is an expanded view of the apparatus of the present invention.

FIG. 1 is an expanded view of the apparatus of the invention. A lead frame 10 having leads 11 attached to mounting pad 12. Lead frame 10 includes side rails 13 having index holes 14. Side rails with index holes permits indexing a strip or continuous roll of lead framed into position for processing.

A carrier or base material 20, having preforms 21 thereon, are positioned under the lead frames 10. Each preform 21 is shaped, for example, to under lie the leads 11 in a ring or square perimeter. The exact shape of preform 21 may vary according to the shape of the lead frame, and the portion of the lead frame to be partially embedded in the preform material. In FIG. 1, the preform has four sides 22 in a square pattern such that each side 22 under lies a set of lead frame leads 11. Carrier 20 has index holes 23 along two edges. These index holes correspond to the index holes 13 in lead frame side rails 13. The carrier/preform may be individually pieces, strips or continuous rolls to correspond to the format of the lead frames.

Positioned below the carrier base 20 and preforms 21 is a support base 30. Support base 30 has index pins 31 along two sides. These pins correspond to the index holes 23 in carrier 20 and holes 14 in lead frame 10.

At the top of FIG. 1, is a heater block 40 mounted on a piston 41. Heater block may be raised and lowered in the process of the invention. A heater block also may be in the support base and the piston used only to apply pressure.

The process of the invention is as follows. A individual, strip or continuous roll of lead frames 10 are moved adjacent an individual, strip or continuous roll of preforms 20 onto support base 30. The index holes in lead frame 10 and carrier 20, 14 and 23 respectively, are aligned on index pins 31 on support base 30. Heater block is moved against a lead frame, applying heat and pressure. The applied heat causes the preform material to melt into the lead frame leads. The preform material flows between the leads encapsulating three sides of the leads, bottom and two sides. When the heater block is removed, the preform material returns to a solid state, firmly hold the leads is a fixed relationship with each other and in a common plane.

Plastic materials such as nylon or polyester may be used. Heat in the range of 150 degree C. to 250 degree C. is applied. The use of plastic materials eliminates the use of adhesives, commonly used with polyimide tapes, which may introduce ionic contaminants.

Figure 2:
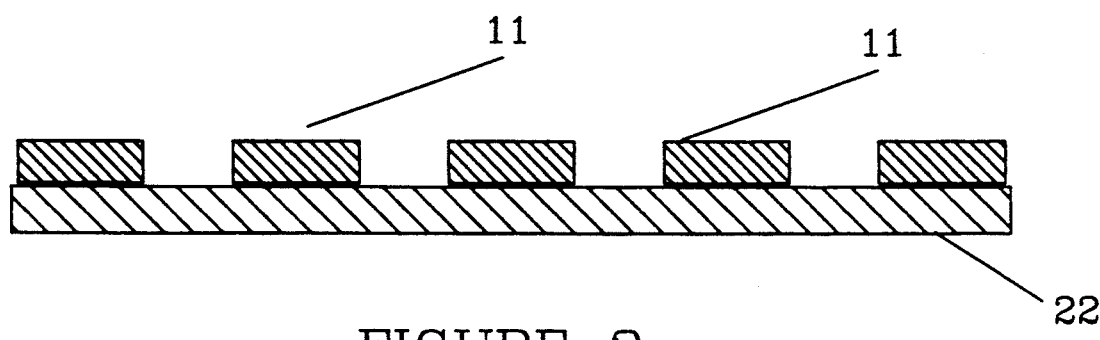
FIG. 2 illustrates the lead frame leads on the preform stabilizer.
Figure 3:
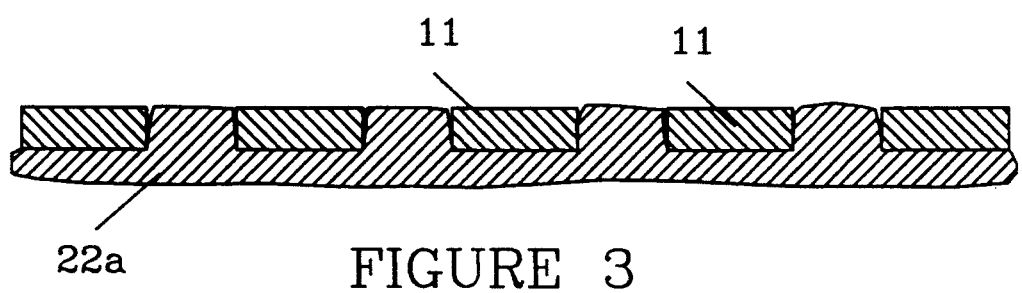
FIG. 3 illustrates the lead frame leads and preform after the preform has been heated and the lead frame leads pressed into the preform.

FIG. 2 illustrates the plastic preform 22 adjacent lead fame leads 11 prior to the application of heat and pressure. FIG. 3 illustrates the flowed plastic 22a around lead frame leads 11 after the application of heat and pressure.

In the given example, the preform under lies a segment of the lead fame internal leads. In practice, the preform could under lie only part of the leads and mounting pad or only part of the leads.

What is claimed:

1. A method for stabilizing multiple leads on a lead frame, including a mounting pad and lead fingers, comprising the steps of:

aligning selected portions of the lead fingers, spaced from the mounting pad, with a plastic preform; and applying heat and pressure to the lead frame and plastic preform to melt the plastic causing it to flow around the selected portions of the lead frame leads, securing them in fixed relationship with each other.

2. The method according to claim 1, wherein the plastic preform is shaped to under lie only the lead frame leads.

3. The method according to claim 1, wherein said plastic preform is on a carrier base which is peeled away after heat has been applied the plastic has solidified around the leads.

4. The method according to claim 1, wherein said preform is on a carrier base with index holes for indexing preforms under lead frames, and for aligning the preform with the lead frame.

5. The method according to claim 4, including the step of aligning the lead frame and preform on a support base utilizing index pins on the support base and index holes in the lead frame and in a preform backing material.

6. A method for stabilizing multiple leads on a lead frame, including a mounting pad and lead fingers, comprising the steps of:

aligning selected intermediate portions of the lead fingers, spaced from the mounting pad, with a plastic preform mounted on a carrier base;

applying heat and pressure to the lead frame and plastic preform to melt the plastic causing it to flow around the lead frame leads securing them in fixed relationship with each other; and removing the preform carrier base.

7. The method according to claim 6, wherein the plastic preform is shaped to under lie only the lead frame leads.

8. The method according to claim 6, wherein said plastic preform is peeled away after heat has been applied and the plastic has solidified around the leads.

9. The method according to claim 6, wherein said carrier base has index holes for indexing preforms under lead frames, and for aligning the preform with the lead frame.

10. The method according to claim 9, including the step of aligning the lead frame and preform on a support base utilizing index pins on the support base and index holes in the lead frame and in a preform backing material.

* * * * *